US009722570B2

(12) United States Patent
Saito

(10) Patent No.: US 9,722,570 B2
(45) Date of Patent: Aug. 1, 2017

(54) COMPLEX CIRCUIT, CIRCUIT DEVICE, CIRCUIT BOARD, AND COMMUNICATION DEVICE

(71) Applicant: TAIYO YUDEN CO., LTD., Tokyo (JP)

(72) Inventor: Toshiyuki Saito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/039,338

(22) PCT Filed: Oct. 28, 2015

(86) PCT No.: PCT/JP2015/080359
§ 371 (c)(1),
(2) Date: May 25, 2016

(87) PCT Pub. No.: WO2016/068177
PCT Pub. Date: May 6, 2016

(65) Prior Publication Data
US 2017/0170800 A1    Jun. 15, 2017

(30) Foreign Application Priority Data
Oct. 28, 2014   (JP) ................................ 2014-218888

(51) Int. Cl.
*H03H 7/46* (2006.01)
*H01F 17/00* (2006.01)
(Continued)

(52) U.S. Cl.
CPC ............ *H03H 7/46* (2013.01); *H03H 7/0115* (2013.01); *H03H 7/42* (2013.01); *H04B 1/40* (2013.01)

(58) Field of Classification Search
CPC .......... H03H 7/42; H03H 7/0115; H03H 7/46; H03H 7/48; H04B 1/40; H01F 17/00;
(Continued)

(56) References Cited

U.S. PATENT DOCUMENTS 5,697,088 A * 12/1997 Gu ...................... H01P 1/20363
333/204
6,483,415 B1 * 11/2002 Tang ................... H01F 17/0013
333/26
(Continued)

FOREIGN PATENT DOCUMENTS

JP    2002-217036 A    8/2002
JP    2014-036345 A    2/2014

OTHER PUBLICATIONS

International Search Report (ISR) issued in PCT/JP2015/080359 mailed in Dec. 2015.
(Continued)

*Primary Examiner* — Pablo Tran
(74) *Attorney, Agent, or Firm* — Chen Yoshimura LLP

(57) ABSTRACT

PROBLEM: To provide a high-performance complex circuit, circuit device, circuit board, and communication device that support a wider band of frequencies.
SOLUTION: A complex circuit includes a first diplexer that passes through the normal-phase signals of balanced signals and a second diplexer that passes through the reverse-phase signals of the balanced signals. A balun includes a low frequency band first balun element and a high frequency band second balun element. The first balun element and the second balun element respectively include a plurality of lines that are connected to the first diplexer and that carry signals occupying two different frequency bands and also respectively include a plurality of lines that are connected to the second diplexer and that carry signals occupying two different frequency bands. The lines form one pair of bal-
(Continued)

anced lines, and the lines form another pair of balanced lines. Furthermore, the first balun element and the second balun element each include an unbalanced line.

11 Claims, 11 Drawing Sheets

(51) Int. Cl.
*H01F 19/06* (2006.01)
*H01F 27/00* (2006.01)
*H03H 7/42* (2006.01)
*H03H 7/01* (2006.01)
*H04B 1/40* (2015.01)

(58) Field of Classification Search
CPC .......... H01F 19/06; H01F 27/00; H01P 1/213; H01P 5/10
See application file for complete search history.

(56) References Cited

U.S. PATENT DOCUMENTS

| | | | | |
|---|---|---|---|---|
| 7,068,122 B2* | 6/2006 | Weng | ........................ | H01P 5/10 333/246 |
| 7,183,872 B2* | 2/2007 | Lee | .......................... | H01P 5/10 333/25 |
| 7,468,640 B2* | 12/2008 | Nosaka | ..................... | H01P 5/10 333/25 |
| 7,471,166 B2* | 12/2008 | Wei | ........................... | H01P 5/10 333/204 |
| 7,541,887 B2* | 6/2009 | Cheng | ....................... | H01P 5/10 333/25 |
| 7,898,362 B2* | 3/2011 | Miyata | ................ | H01F 17/0013 333/175 |
| 8,008,992 B2* | 8/2011 | Chen | ....................... | H03H 7/09 333/167 |
| 8,319,577 B2* | 11/2012 | Endo | ................... | H01F 17/0013 333/238 |
| 8,339,218 B2* | 12/2012 | Chuang | .................... | H03H 7/09 333/167 |
| 8,964,605 B1* | 2/2015 | Ansari | ..................... | H03H 7/42 370/278 |
| 9,035,717 B2 | 5/2015 | Tanaka | | |
| 9,368,857 B2* | 6/2016 | Leong | ....................... | H01P 5/12 |

OTHER PUBLICATIONS

Written Opinion (PCT/ISA/237) issued in PCT/JP2015/080359 mailed in Dec. 2015.

* cited by examiner

A

B

COMPLEX CIRCUIT, CIRCUIT DEVICE, CIRCUIT BOARD, AND COMMUNICATION DEVICE

TECHNICAL FIELD

The present invention relates to a technology such as a complex circuit for removing unnecessary interfering waves or for multiplexing and demultiplexing a plurality of signals. Typically, the present invention relates to a technology for use in wireless communication devices that can communicate using the Long-Term Evolution (LTE) wireless communication standard.

Here, "interfering waves" refers to unwanted signals outside of the desired frequency band, such as wireless signals sent from another transmitter, wireless signals sent from a transceiver, or unwanted electromagnetic radiation from another integrated circuit (IC), for example.

BACKGROUND ART

Wireless communication devices such as smartphones are being used on an increasingly global basis, and devices that can be used in multiple countries are in demand. In recent years, for example, communication systems such as LTE have begun to be introduced in many countries. However, in many cases the frequency bands used in each country are different. As a result, in recent years the number of frequency bands that a single wireless communication device must support has increased.

Wireless communication devices include circuits that include duplexers and various types of filters for each frequency band established in the communication systems used. Diplexers and semiconductor switches are provided between these circuits and an antenna. Due to the increasing sophistication of communication technologies in recent years, devices that can simultaneously communicate between these systems are in demand, and diplexers that function as the interfaces between the circuits for each communication system (frequency band) and the antenna have attracted increased attention. A diplexer is a filter circuit for multiplexing and demultiplexing signals on a plurality of frequency bands.

Wireless communication devices utilize circuit components such as directional couplers and balanced/unbalanced converters (baluns) in order to implement power control during communication, for example. Couplers extract a portion of the output power from a power amplifier (PA). Baluns convert balanced signals to unbalanced signals or convert unbalanced signals to balanced signals.

Complex circuits in which a diplexer and a balun, for example, are integrated together have already been developed and brought to market (see Patent Document 1, for example). These types of complex circuits in which several circuit components are integrated together make it possible to achieve further miniaturization of the electronic devices (such as wireless communication devices) that are equipped with such complex circuits.

The complex circuit disclosed in Patent Document 1, for example, includes a single balun and a multiplexing/demultiplexing circuit (a diplexer). The balun includes four lines, among which an unbalanced transmission line and a pair of balanced transmission lines are included. The multiplexing/demultiplexing circuit includes a low-pass filter and a high-pass filter. In the overall complex circuit, the low-pass filter and the high-pass filter of the multiplexing/demultiplexing circuit are connected in parallel to the unbalanced transmission line of the balun.

RELATED ART DOCUMENT

Patent Document

Patent Document 1: Japanese Patent Application Laid-Open Publication No. 2002-217036

SUMMARY OF THE INVENTION

Problems to be Solved by the Invention

In the circuit components of the complex circuit disclosed in Patent Document 1, signals of all of frequency bands that pass through the multiplexing/demultiplexing circuit also pass through the balun. Therefore, the balun must have wide-band pass characteristics. The increase in the number of frequency bands used in recent years has resulted in demand for baluns with increasingly wider-band pass characteristics.

In light of the foregoing, the present invention aims to provide a high-performance complex circuit, circuit device, circuit board, and communication device that support a wider band of frequencies.

Means for Solving the Problems

In order to achieve the abovementioned objective, a circuit according to one embodiment of the present invention includes a multiplexing/demultiplexing unit, and a balun unit, wherein the multiplexing/demultiplexing unit has a first multiplexing/demultiplexing unit that passes normal-phase signals of balanced signals of a plurality of differing frequency bands, and a second multiplexing/demultiplexing unit that passes reverse-phase signals of the balanced signals, and wherein the balun unit includes a plurality of balun elements, each balun element having a single unbalanced line and a pair of balanced lines, the balanced lines being respectively connected to the first multiplexing/demultiplexing unit and the second multiplexing/demultiplexing unit for respectively passing the normal-phase signals and the reverse-phase signals of one of the frequency bands.

In this circuit, the first multiplexing/demultiplexing unit multiplexes and/or demultiplexes the signals that occupy the plurality of different frequency bands. Furthermore, the plurality of baluns that respectively pass through the signals that occupy the plurality of frequency bands convert the unbalanced signals to balanced signals. This makes it possible to provide a complex circuit that supports a wider band of frequencies and can perform the balanced/unbalanced signal conversion with high precision.

Here, "multiplexing/demultiplexing unit" refers to a device that at least multiplexes or demultiplexes signals.

The first multiplexing/demultiplexing unit may have a first low-pass filter and a first high-pass filter. The second multiplexing/demultiplexing unit may have a second low-pass filter that has a same cutoff frequency as the first low-pass filter and a second high-pass filter that has a same cutoff frequency as the first high-pass filter.

This makes it possible to make the passbands of the filters substantially equal for the signals sent to the plurality of balun elements.

The circuit may further include attenuation circuits that form attenuation poles for each of the frequency bands and that are respectively connected to the unbalanced lines of the balun elements.

A circuit device according to the present invention includes a multilayer member having a plurality of sheets on which conductive patterns are respectively layered together. The multilayer member has a first circuit pattern and a second circuit pattern. The first circuit pattern forms a multiplexing/demultiplexing circuit. The second circuit pattern forms a balun unit.

This makes it possible to provide a circuit that supports a wider band of frequencies and can perform the balanced/unbalanced signal conversion with high precision.

The multilayer member may further include a ground electrode sheet on which a ground electrode is formed. With respect to the multilayer member, one or more sheets of the first circuit pattern on which is formed a conductive pattern other than a conductive pattern formed on the ground electrode sheet is arranged between the ground electrode sheet and one or more sheets of the second circuit pattern on which is formed a conductive pattern other than the conductive pattern formed on the ground electrode sheet.

This makes it possible to keep the conductive patterns of the second circuit pattern that forms the balun separated from the ground electrode. As a result, formation of parasitic capacitance between the ground electrode and striplines of the balun is reduced. This, in turn, makes it possible to support a wider band of frequencies even when the circuit device is miniaturized.

At least the second circuit pattern may have a first area and a second area. In the first area are formed lines that, among the signals of the plurality of frequency bands, pass signals that have a first frequency band. The second area is arranged separately from the first area when viewed from a layering direction of the multilayer member, and in the second area are formed lines that, among the signals of the plurality of frequency bands, pass signals that have a second frequency band differing from the first frequency band.

Dividing the areas according to passband frequency makes it possible to reduce electromagnetic coupling between the first frequency band signals and the second frequency band signals.

Inductor electrodes that form a part of the first circuit pattern may be divided between the first area and the second area when viewed from the layering direction of the multilayer member.

Dividing not only the components of the second circuit pattern but also the components of the first circuit pattern between the areas according to passband frequency further contributes to reducing electromagnetic coupling.

A length of the lines formed in the first area of the second circuit pattern may be different than a length of the lines formed in the second area of the second circuit pattern.

In other words, the first and second balun elements may be designed to use different balanced line lengths according to the frequencies of the signals carried thereby. This makes it possible to form the lines of first area as well as the lines of the second area in a plurality of respectively identical sheets, thereby making it possible to reduce the height of the element (that is, to make the element thinner).

The multilayer member may include a first sheet and a second sheet. The first sheet has a first thickness and forms a part of the second circuit pattern. The second sheet forms a part of the second circuit pattern, is arranged between the one or more first sheets of the second circuit pattern and a sheet of the first circuit pattern, and has a second thickness that is greater than the first thickness.

This makes it possible to maintain a distance of greater than or equal to a prescribed value between the multiplexing/demultiplexing unit and the balun. This, in turn, makes it possible to prevent signal leakage due to electromagnetic coupling between the lines of the second circuit pattern that forms the balun and the inductors of the multiplexing/demultiplexing unit, which can potentially cause deterioration of attenuation properties.

A circuit board according to the present invention includes a substrate, the abovementioned first circuit pattern, and the abovementioned second circuit pattern. At least one of lines of the first circuit pattern and lines of the second circuit pattern are formed on the substrate.

A communication device according to the present invention includes: an antenna that receives signals of a plurality of differing frequency bands or that outputs the signals; and the above mentioned circuit.

Effects of the Invention

As described above, the present invention makes it possible to provide a high-performance complex circuit, circuit device, circuit board, and communication device that support a wider band of frequencies.

DETAILED DESCRIPTION OF EMBODIMENTS

Figure 1:
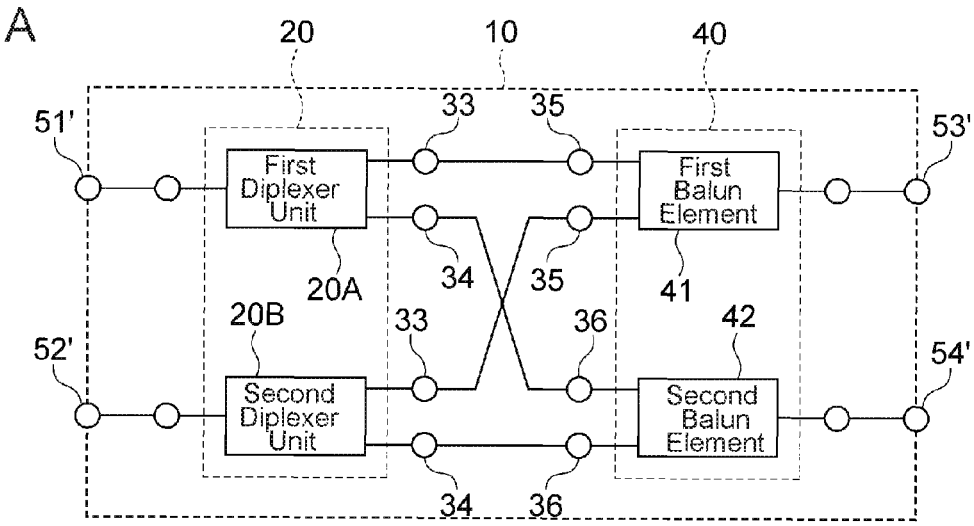
FIG. 1A is a block diagram that functionally and schematically illustrates a complex circuit according to an embodiment of the present invention.
FIG. 1B is a block diagram that functionally and schematically illustrates a conventional complex circuit.
Figure 1:
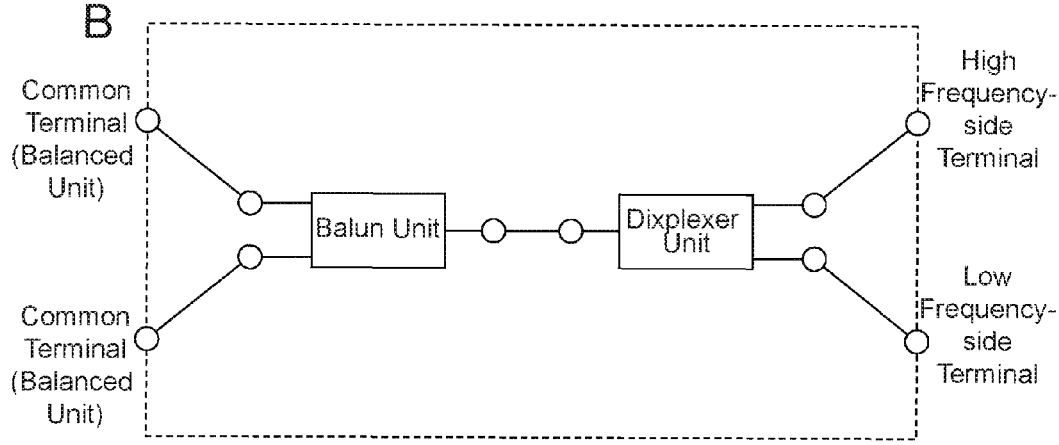

Next, embodiments of the present invention will be described with reference to figures.

1. Complex Circuit (1) Functional Configuration of Complex Circuit

FIG. 1A is a block diagram that functionally and schematically illustrates a complex circuit according to an embodiment of the present invention. A complex circuit 10 includes a diplexer (a multiplexing/demultiplexing unit) 20 that multiplexes and/or demultiplexes signals on each frequency band. More specifically, the diplexer 20 includes a first diplexer (a first multiplexing/demultiplexing unit) 20A and a second diplexer (a second multiplexing/demultiplexing unit) 20B.

The complex circuit 10 also includes a balun 40 that converts balanced signals to unbalanced signals or converts unbalanced signals to balanced signals. The balun 40 includes a plurality of balun elements such as a first balun element 41 and a second balun element 42, for example.

The complex circuit 10 includes a low frequency terminal 53' and a high frequency terminal 54' to which unbalanced signals are input (or from which unbalanced signals may be output; this applies to the following descriptions as well) as well as common terminals 51' and 52' from which balanced signals are output (or to which balanced signals may be input; this applies to the following descriptions as well).

The unbalanced signals input to the complex circuit 10 from outside of the complex circuit 10 are signals that each occupy different frequency bands. The present embodiment assumes that these signals that occupy a plurality of different frequency bands include a low frequency band signal that occupies a relatively low frequency band and a high frequency band signal that occupies a relatively high frequency band. The low frequency band signal is input to the low frequency terminal 53', and the high frequency band signal is input to the high frequency terminal 54'.

The first balun element 41 is connected to the low frequency terminal 53'. The second balun element 42 is connected to the high frequency terminal 54'.

The common terminals 51' and 52' are balanced signal terminals that output phase-inverted signals (a positive signal and an inverted signal). For convenience, the following description assumes that the common terminal 51' is the positive signal terminal and the common terminal 52' is the inverted signal terminal.

The low frequency terminals 33 of the first diplexer 20A and the second diplexer 20B are connected to the balanced terminals 35 of the (low frequency-side) first balun element 41. The high frequency terminals 34 of the first diplexer 20A and the second diplexer 20B are connected to the balanced terminals 36 of the (high frequency-side) second balun element 42.

(2) Hardware Configuration of Complex Circuit (Circuit Configuration)

Figure 2:
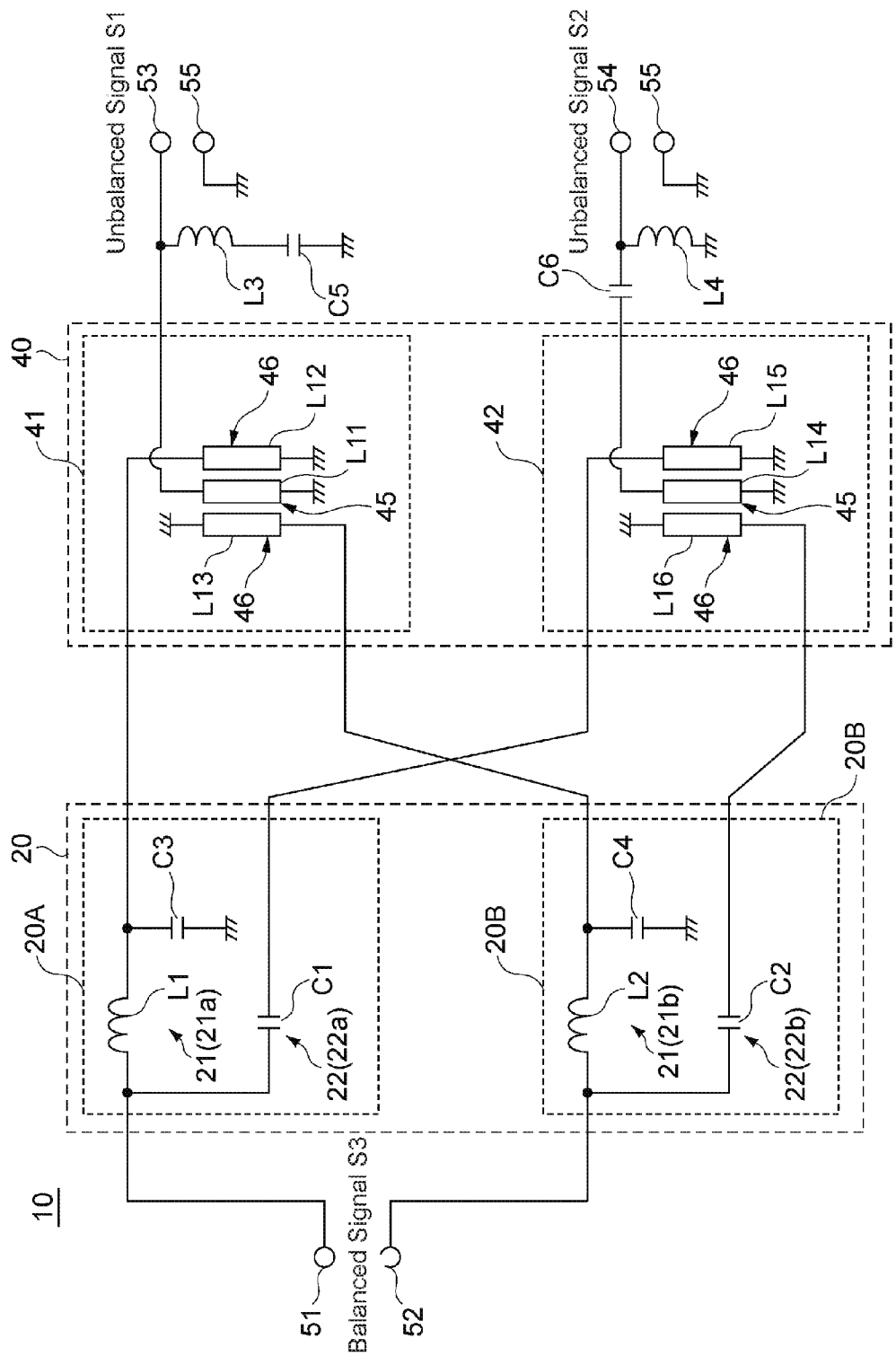
FIG. 2 is a circuit diagram illustrating the complex circuit.

FIG. 2 is a circuit diagram illustrating the complex circuit 10. The balun 40 includes the low frequency band-side first balun element 41 and the high frequency band-side second balun element 42, which correspond to each supported frequency band. The first balun element 41 and the second balun element 42 each include a single unbalanced line 45 and a pair of balanced lines 46.

The unbalanced lines 45 of the balun 40 are constituted by transmission lines L11 and L14. One of the ends of the unbalanced lines 45 are connected to unbalanced terminals 53 and 54, and the other ends are connected to the ground. The pairs of balanced lines 46 are constituted by transmission lines L12 and L13 and transmission lines L15 and L16. In other words, the complex circuit 10 includes a plurality of the pairs of balanced lines 46. One of the ends of the pairs of balanced lines 46 are connected to the ground, and the other ends are connected to the diplexer 20. Here, the reference characters 55 indicate ground terminals.

The transmission lines L11 to L16 each have an electrical length equal to approximately ¼ of the wavelength of the desired frequency to be carried on that line. L11 is electromagnetically coupled with L12 and L13, and L14 is electromagnetically coupled with L15 and L16.

One end of an inductor L3 is connected to the low frequency-side unbalanced line 45, and the other end of the inductor L3 is connected to one of the electrodes of a capacitor C5. The other electrode of the capacitor C5 is connected to the ground. A capacitor C6 is connected to the high frequency-side unbalanced line 45, and an inductor L4 is connected in parallel with the capacitor C6 to the ground. The values of the inductors L3 and L4 and the capacitors C5 and C6 can be adjusted as part of the impedance matching design of the balun 40. Moreover, the inductors L3 and L4 and the capacitors C5 and C6 function as attenuation circuits and are used to form the appropriate attenuation poles for each filter pass frequency of the balun 40.

Each diplexer included in the diplexer 20 includes a second order low-pass filter 21 and a first order high-pass filter 22. A first low-pass filter 21a of the first diplexer 20A includes an inductor L1 and a capacitor C3. A second low-pass filter 21b of the second diplexer 20B includes an inductor L2 and a capacitor C4. A first high-pass filter 22a of the first diplexer 20A includes a capacitor C1. A second high-pass filter 22b of the second diplexer 20B includes a capacitor C2.

One of the ends of the low-pass filters 21 are connected to the transmission lines L12 and L13 that constitute one of the pairs of the balanced lines 46, and the other ends of the low-pass filters 21 are connected to balanced terminals 51 and 52. Similarly, one of the ends of the high-pass filters 22 are connected to the transmission lines L15 and L16 that constitute the other pair of the balanced lines 46, and the other ends of the high-pass filters 22 are connected to balanced terminals 51 and 52.

The inductors L1 and L2 and the capacitors C3 and C4 are designed such that the cutoff frequencies of the first low-pass filter 21a and the second low-pass filter 21b are substantially equal. Similarly, the capacitors C1 and C2 are designed such that the cutoff frequencies of the first high-pass filter 22a and the second high-pass filter 22b are substantially equal.

Moreover, the inductors L1 and L2 and the capacitors C3 and C4 of the low-pass filters 21 are designed such that the impedance thereof increases within the passband of the high-pass filters 22. Similarly, the capacitors C1 and C2 of the high-pass filters 22 are designed such that the impedance thereof increases within the passband of the low-pass filters 21.

(3) Operation of Complex Circuit

Unbalanced signals S1 and S2 are input to the unbalanced terminals 53 and 54, respectively. These unbalanced signals S1 and S2 are converted to balanced signals by the balun 40 and then input to the diplexer 20, which multiplexes the signals together. The resulting signal is then output from the balanced terminals 51 and 52 as a balanced signal S3.

Conversely, when a balanced signal S3 is input to the balanced terminals 51 and 52, the diplexer 20 demultiplexes that signal to produce a low frequency band signal and a high frequency band signal, which are then input to the balun 40. The balun 40 converts the balanced signals to unbalanced signals, which are then output from the unbalanced terminals 53 and 54 as unbalanced signals S1 and S2.

Using the complex circuit 10 in this manner makes it possible to demultiplex a single balanced signal into two unbalanced signals: a low frequency band signal and a high frequency band signal. Meanwhile, the complex circuit 10 also makes it possible to multiplex two unbalanced signals on different frequency bands together into a single balanced signal.

A given balun circuit has certain optimum frequency band pass characteristics that make it possible to perform the balanced/unbalanced signal conversion with high precision. The low-pass filters 21 and the high-pass filters 22 are connected, respectively, to the first balun element 41 and the second balun element 42, for which the pass characteristics have been optimized appropriately. This makes it possible for the complex circuit 10 to exhibit low insertion loss and high balanced/unbalanced signal conversion precision. In other words, the present embodiment makes it possible to provide the high-performance complex circuit 10, which supports a wider frequency band.

FIG. 1B is a block diagram that functionally illustrates a complex circuit as illustrated in FIG. 1 of Patent Document 1. The complex circuit in Patent Document 1 includes only a single balun and a single diplexer that are connected together and therefore cannot support the wider frequency band that is supported by the present embodiment.

2. Comparison with Conventional Complex Circuit

Figure 3:
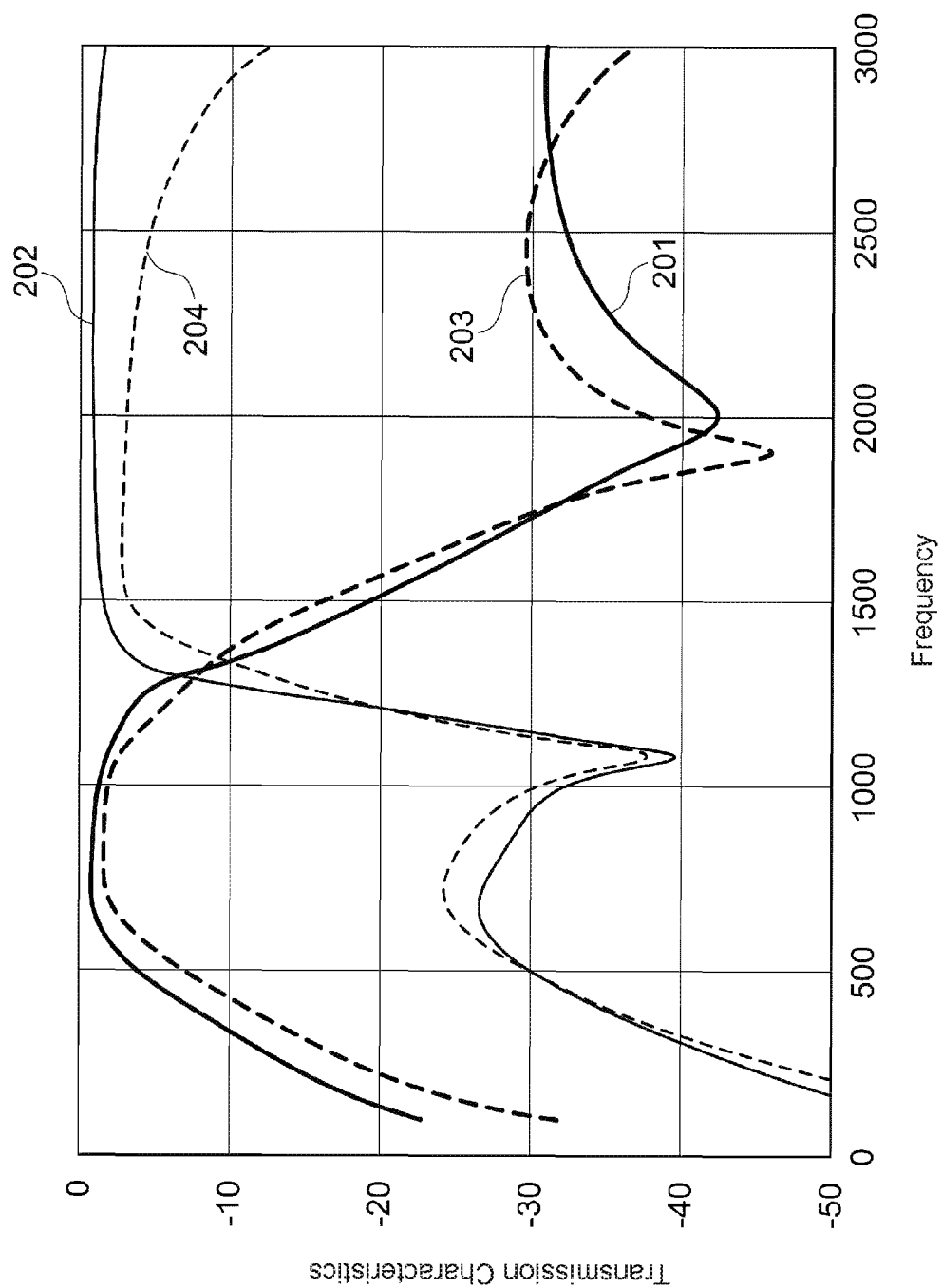
FIG. 3 is a graph showing the pass characteristic of a circuit device.

FIG. 3 is a graph showing the pass characteristic of a circuit device 10A. The solid line 201 represents the low frequency band pass characteristics, and the solid line 202 represents the high frequency band pass characteristics. In the present embodiment, the low frequency passband is set to 699 to 960 MHz, and the high frequency passband is set to 1710 to 2690 MHz. Moreover, the pass characteristics of the conventional complex circuit illustrated in FIG. 1B are shown by the dashed lines 203 and 204 for purposes of comparison.

The conventional complex circuit exhibits a maximum insertion loss of 2 dB in the low frequency passband and a maximum insertion loss of 6 dB in the high frequency passband. This happens because a single balun is used for the balanced/unbalanced signal conversion for both the low frequency band signal and the high frequency band signal, and it is difficult to achieve a wider band of pass frequencies using just a single balun.

Meanwhile, the circuit device 10A of the present embodiment exhibits a maximum insertion loss of 1.2 dB in the low frequency passband and a maximum insertion loss of 1.1 dB in the high frequency passband. The circuit device 10A utilizes the complex circuit 10 described above, thereby making it possible to reduce insertion loss by as much as 4.9 dB (from 6 dB to 1.1 dB) and to provide a high-performance complex circuit component.

Figure 4:
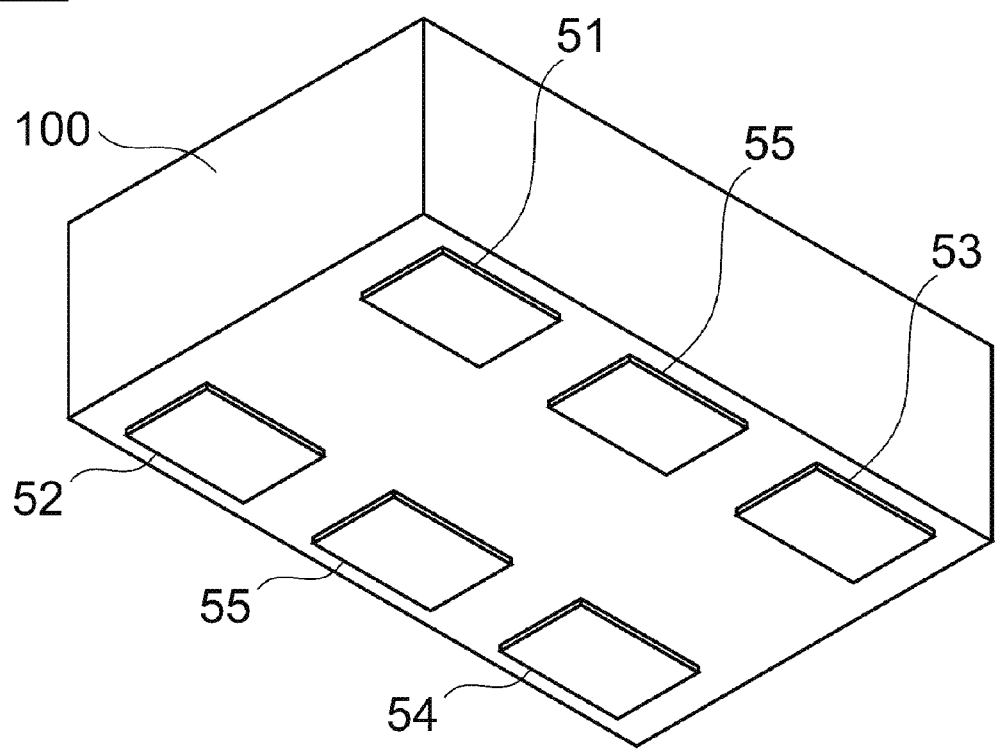
FIG. 4 is a perspective view illustrating an example of a circuit device that includes the circuit components that constitute the complex circuit.
Figure 5:
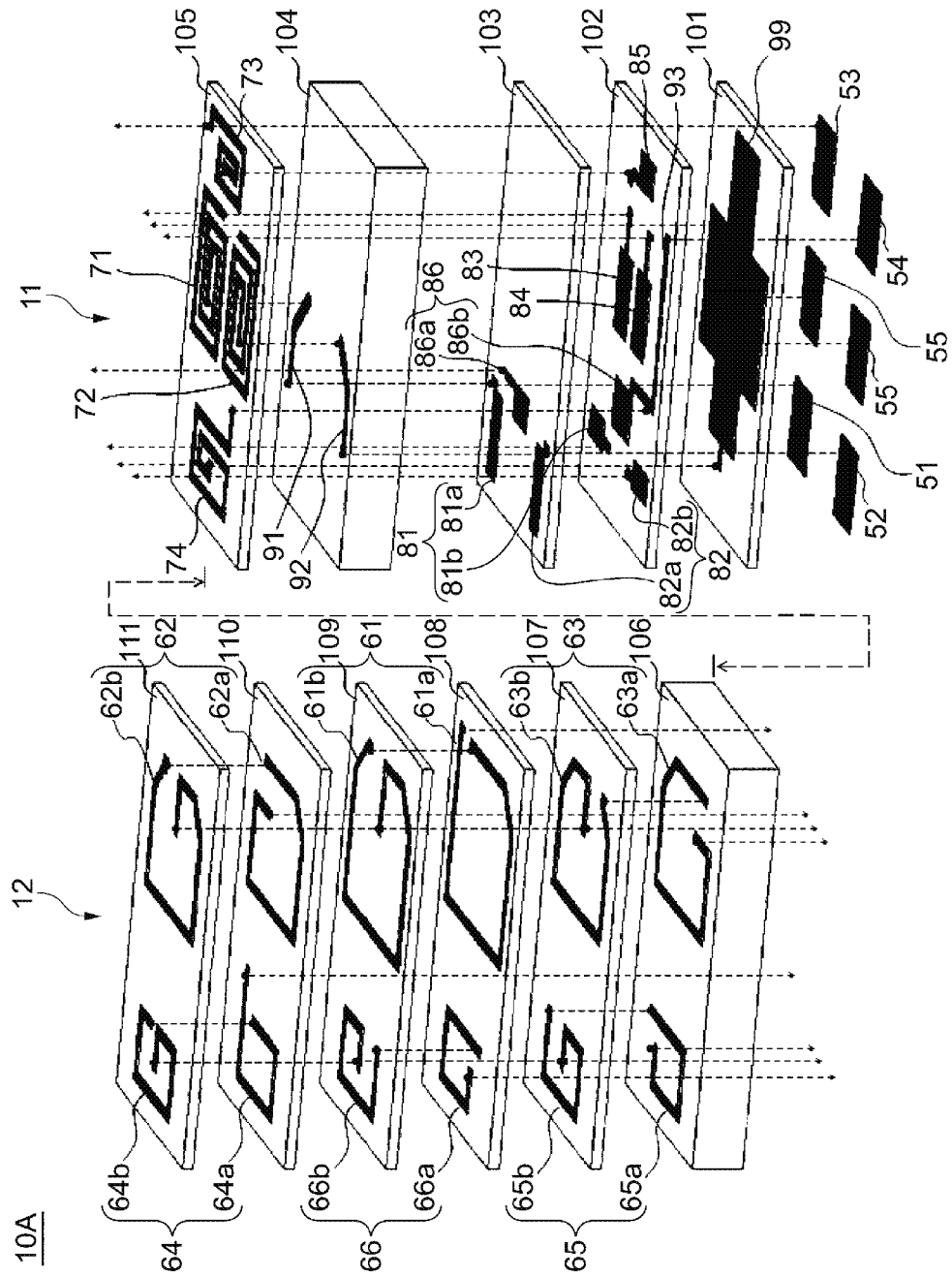
FIG. 5 is an exploded perspective view of the circuit device.

3. Complex Circuit Implemented as Circuit Device (1) Overall Configuration of Circuit Device FIG. 4 is a perspective view illustrating an example of a circuit device that includes the circuit components that constitute the complex circuit 10 illustrated in FIG. 2. FIG. 5 is an exploded perspective view of this circuit device 10A. The circuit device 10A includes a multilayer member 100 in which a plurality of dielectric sheets are layered together (as will be described in more detail later).

As illustrated in FIG. 4, the balanced terminals 51 and 52, the unbalanced terminals 53 and 54, and the ground terminals 55 as described above are formed on one surface (a mounting surface which will be mounted on a mounting substrate) of the multilayer member 100 of the circuit device 10A, for example.

As illustrated in FIG. 5, the circuit device 10A includes sheet-shaped dielectric sheets 101 to 111 which are formed using a method such as doctor blading. Moreover, the desired conductive patterns (electrode patterns) are formed on top of the dielectric sheets 101 to 111 using a conductive paste. For convenience, these dielectric sheets on which the conductive patterns are formed will be referred to simply as "sheets" in the following description. The multilayer member 100 is formed by layering these sheets 101 to 111 in order from bottom to top.

A material such as a low temperature co-fired ceramic (LTCC) or a high temperature co-fired ceramic (HTCC), for example, may be selected as the dielectric material.

The multilayer member 100 primarily includes a first circuit pattern 11 that forms the diplexer 20 and a second circuit pattern 12 that forms the balun 40. Note that in FIG. 5, the sheet 101 is a ground electrode sheet in which a ground electrode 99 is formed, and this ground electrode sheet is depicted to be arranged on the first circuit pattern 11 side simply for purposes of convenience. The ground electrode 99 is electrically connected to the ground terminals 55 through via holes or the like (not illustrated in the figure).

Capacitor electrodes 83, 84, and 85 that constitute the capacitors C3, C4, and C5, respectively, are formed on top of the dielectric sheet 102. Capacitor electrodes 81*b*, 82*b*, and 86*b* form pairs with capacitor electrodes 81*a*, 82*a*, and 86*a* formed on top of the dielectric sheet 103, thereby forming the capacitors C1, C2, and C6 described above.

Moreover, the capacitor electrode 86*b* is connected to the unbalanced terminal 54 via a connector electrode 93. The capacitor electrodes 81*a* and 82*a* are connected to the balanced terminals 51 and 52 through via holes.

Inductor electrodes 71, 72, and 73 that constitute the inductors L1, L2, and L3, respectively, are formed on top of the dielectric sheet 105. The inductor L4 is constituted by an inductor electrode 74.

One of the ends of the inductor electrodes 71 and 72 are connected to the balanced terminals 51 and 52 via connector electrodes 91 and 92 formed on top of the dielectric sheet 104. The other ends of the inductor electrodes 71 and 72 are connected to the capacitor electrodes 83 and 84. One end of the inductor electrode 73 is connected to the unbalanced terminal 53, and the other end is connected to the capacitor electrode 85. One end of the inductor electrode 74 is connected to the capacitor electrode 86*b*, and the other end is connected to the ground electrode 99.

Here, the inductor electrodes 71, 73, and 74 are all formed on top of the same dielectric sheet, but the same effect is achieved if these inductor electrodes are formed on a plurality of different dielectric sheets. This applies to the balun as well. The inductor electrodes may also be formed as two-layer structures in order to decrease the conductivity thereof and thereby improve the Q factors of the inductors.

The thickness of the sheet 104 is greater than the thickness of each of the other sheets 101 to 103 and 105. This configuration makes it possible to reduce any potential deterioration of the Q factor of the inductors due to the inductor electrodes 71, 73, and 74 being too close to the ground electrode 99 formed on top of the sheet 101, for example. It is preferable that the thickness of the sheet 104 be greater than or equal to 100 μm.

Of the sheets 106 to 111 that form the balun 40, the thickness (a second thickness) of the sheet 106 (a second sheet) is greater than the thickness (a first thickness) of each of the other sheets 107 to 111 (one or more first sheets). The reason for this will be described in more detail later. The sheet that has the second thickness does not necessarily need to be a single sheet and may instead be a plurality of sheets.

Stripline electrodes 63a and 65a are formed on top of the dielectric sheet 106. The stripline electrodes 63a and 65a are connected to stripline electrodes 63b and 65b formed on top of the dielectric sheet 107. The stripline electrodes 63a and 63b form the transmission line L13. One end of the transmission line L13 is connected to the inductor electrode 72, and the other end is connected to the ground electrode 99. The stripline electrodes 65a and 65b form the transmission line L15. One end of the transmission line L15 is connected to the capacitor electrode 81b, and the other end is connected to the ground electrode 99.

Stripline electrodes 61a and 66a are formed on top of the dielectric sheet 108. The stripline electrodes 61a and 66a are connected to stripline electrodes 61b and 66b formed on top of the dielectric sheet 109. The stripline electrodes 61a and 61b form the transmission line L11. One end of the transmission line L11 is connected to the inductor electrode 73, and the other end is connected to the ground electrode 99. The stripline electrodes 66a and 66b form the transmission line L16. One end of the transmission line L16 is connected to the capacitor electrode 82b, and the other end is connected to the ground electrode 99.

Stripline electrodes 62a and 64a are formed on top of the dielectric sheet 110. The stripline electrodes 62a and 64a are connected to stripline electrodes 62b and 64b formed on top of the dielectric sheet 111. The stripline electrodes 62a and 62b form the transmission line L12. One end of the transmission line L12 is connected to the inductor electrode 71, and the other end is connected to the ground electrode 99. The stripline electrodes 64a and 64b form the transmission line L14. One end of the transmission line L14 is connected to the capacitor electrode 86a, and the other end is connected to the ground electrode 99.

The electrodes described above are formed on top of the dielectric sheets using a method such as screen printing or a transfer method. The electrodes are made from a material such as Ag, Pd, Pt, Cu, Ni, Au, Ag—Pd, or Ag—Pt. After the electrodes are formed on the dielectric sheets, the multilayer member 100 is formed by layering the sheets together using heat-pressing or by adhering the sheets together using an adhesive.

The multilayer member 100 is then sintered at a high temperature of greater than or equal to 700° C., for example. External terminal electrodes may be formed as necessary on the multilayer member 100 using a method such as screen printing or a transfer method. Then a plating process is performed as necessary, thereby completing the circuit device 10A.

In the complex circuit disclosed in Patent Document 1, the balun is arranged between the ground electrodes, thereby resulting in formation of parasitic capacitance between the stripline electrodes used in the balun and the ground electrode. This parasitic capacitance impedes expansion of the pass characteristics of the balun. Moreover, this parasitic capacitance increases in severity as the element is made smaller and thinner. Therefore, the complex circuit disclosed in Patent Document 1 is difficult to miniaturize and would exhibit a large insertion loss if used in the multi-band mobile devices developed in recent years.

In the circuit device 10A according to the present embodiment, however, the diplexer 20 is arranged between the balun 40 and the sheet 101 in which the ground electrode 99 is formed. More specifically, the sheets 102 to 105 (sheets other than the sheet 101) of the first circuit pattern 11 that forms the diplexer 20 are arranged between the sheet 101 and the sheets 106 to 111 (sheets other than the sheet 101) of the second circuit pattern 12 that forms the balun 40.

This configuration makes it possible to minimize the parasitic capacitance formed between the ground electrode 99 and the stripline electrodes of the balun 40. This, in turn, makes it possible to give the balun 40 wider-band pass characteristics even when the circuit device 10A is miniaturized.

In cases such as the following, the problem described above does not occur even if the diplexer 20 is not arranged between the balun 40 and the ground electrode 99.

Cases in which a sufficient distance can be established between the ground electrode 99 and the balun 40.

Cases in which a low-κ material with a relative permittivity of less than or equal to 5, for example, can be used as the material for the dielectric sheets in order to inhibit parasitic capacitance.

Cases in which a material with a low relative permittivity (such as a dissimilar material) is partially inserted into the balun 40 or between the balun 40 and the ground electrode 99 and then the components are bonded together.

(2) Setting Areas for Conductive Patterns for Each Frequency Band

Figure 6:
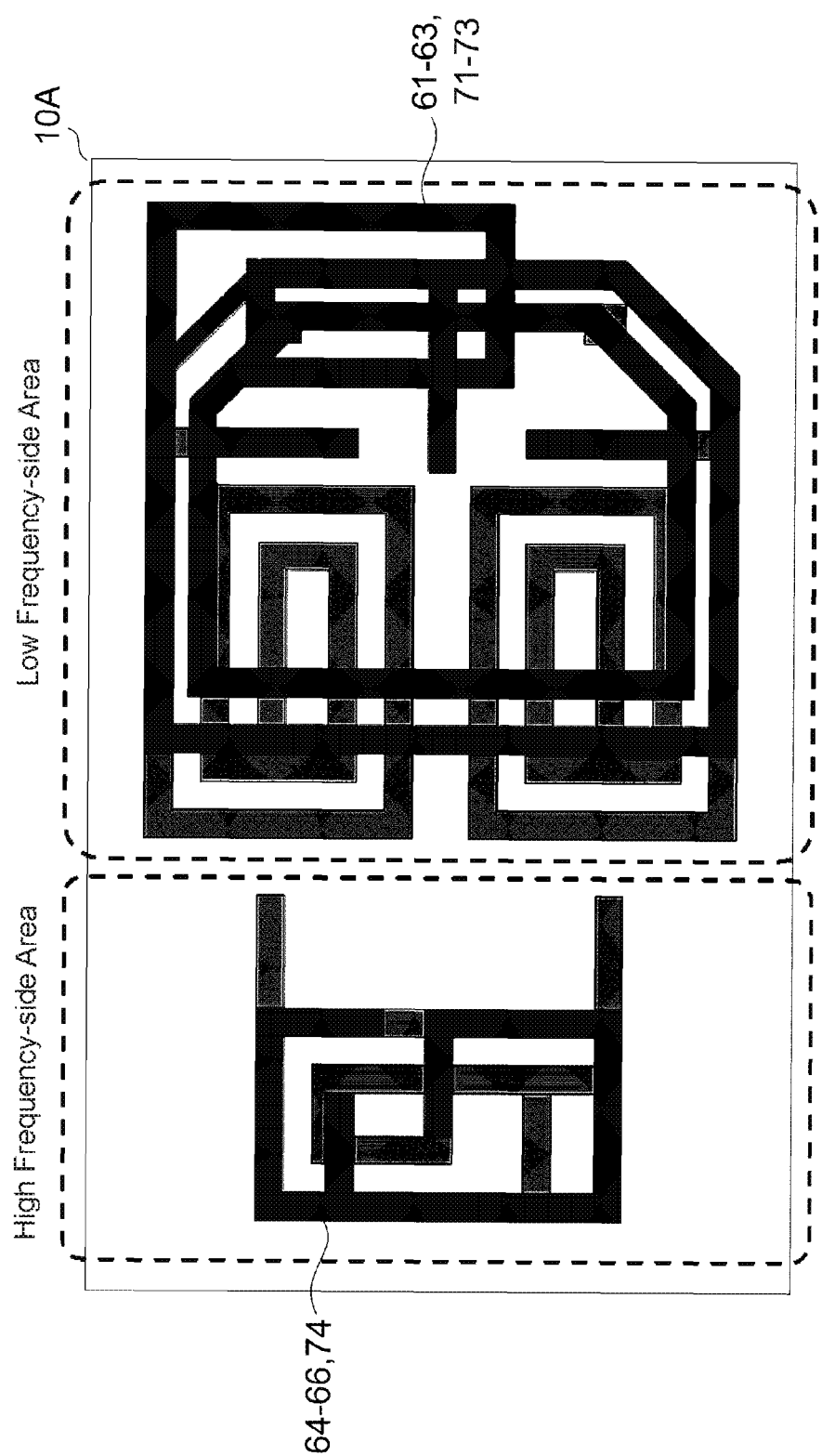
FIG. 6 is a see-through view of the circuit device as viewed from the layering direction.

FIG. 6 is a see-through view of the circuit device 10A as viewed from the layering direction. For simplicity, FIG. 6 only depicts the conductive patterns that form the stripline electrodes of the balun 40 and the inductor electrodes of the diplexer 20.

The stripline electrodes and the inductor electrodes are divided into a low frequency band (a first frequency band) area (a first area) and a high frequency band (a second frequency band) area (a second area). In other words, the stripline electrodes 61 to 63 of the balun 40 that is used in the low frequency band circuit as well as the inductor electrodes 71 to 73 that form the low-pass filters 21 or the like are formed in the low frequency band area. Meanwhile, the stripline electrodes 64 to 66 of the balun 40 that is used in the high frequency band circuit as well as the inductor electrode 74 that forms the low-pass filters 22 or the like are formed in the high frequency band area.

These stripline electrodes and inductor electrodes tend to be prone to electromagnetic coupling. As a result, if the stripline electrodes and the inductor electrodes are all formed in the same area, signals may leak between the electrodes due to this electromagnetic coupling, thereby negatively impacting the function of the diplexer. Therefore, dividing the areas according to passband frequency makes it possible to reduce electromagnetic coupling between high frequency band signals and low frequency band signals.

Furthermore, because the wavelength of the low frequency band signals is longer than the wavelength of the high frequency band signals, the stripline electrodes and the inductor electrodes in the low frequency band area are designed to be longer than the stripline electrodes and the inductor electrodes in the high frequency band area. As a result, when viewed from the layering direction, the area (the envelope area) that envelops the conductive patterns in the low frequency band area is larger than the area (the envelope area) that envelops the conductive patterns in the high frequency band area. This configuration makes it possible to form the lines of the low frequency band area as well as the lines of the high frequency band area in a plurality of respectively identical sheets, thereby making it possible to reduce the height of the device (that is, to make the device thinner).

(3) Setting Distance Between Diplexer and Balun

Next, the reason for making the thickness of the sheet 106 the greatest out of the sheets 106 to 111 of the balun 40 will be described. The sheet 106 is arranged between the one or more sheets 107 to 111 of the balun 40 and the sheet 105 of the diplexer 20. In other words, the sheet 106 is the sheet of the balun 40 that is arranged closest to the diplexer 20.

Making the thickness of this sheet 106 greater than the thickness of the other sheets makes it possible to maintain a distance of greater than or equal to a prescribed value between the diplexer 20 and the balun 40. Next, this configuration will be described in more detail.

Here, this "distance" refers to the distance between the closest positions in the envelope area that envelops the lines of the balun 40 and the envelope area that envelops the lines of the diplexer 20.

Figure 7:
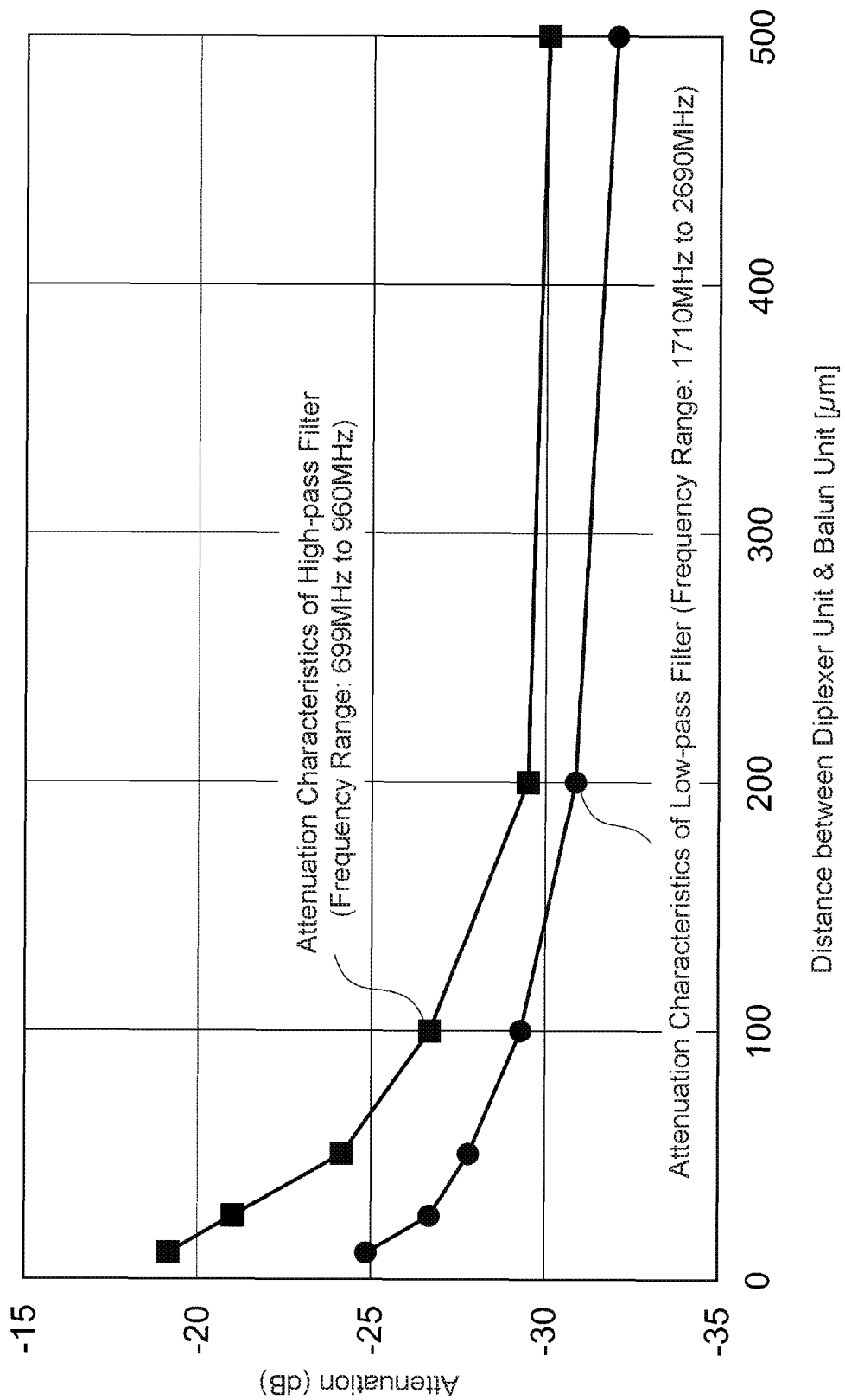
FIG. 7 is a graph showing changes in attenuation properties when the distance between a diplexer and a balun is changed.

FIG. 7 is a graph showing changes in attenuation properties when the distance between the diplexer and the balun is changed. The low-pass filters of the diplexer attenuate the high frequency band frequencies (1710 to 2690 MHz in the present embodiment), and the high-pass filters attenuate the low frequency band frequencies (699 to 960 MHz in the present embodiment). In this graph, the more negative the attenuation becomes (moving towards negative infinity), the higher the attenuation that is achieved. High attenuation represents a desirable performance characteristic of the diplexer.

As shown in FIG. 7, the attenuation properties suffer as the distance between the diplexer and the balun decreases, and conversely, the attenuation properties improve as this distance increases. This is because when the distance between the diplexer and the balun is small, the stripline electrodes of the balun and the inductor electrodes of the diplexer tend to exhibit electromagnetic coupling, and the resulting signal leakage causes the attenuation properties to suffer.

Even if the diplexer is originally designed to have sufficient attenuation performance, this kind of signal leakage can still result in a deterioration of the attenuation properties of the diplexer. To prevent such deterioration in attenuation properties, a distance of at least 50 μm must be established between the diplexer and the balun. In the present embodiment, forming the sheet 106 to have a prescribed thickness as described above makes it possible to maintain a distance of greater than or equal to a prescribed value between the diplexer and the balun. In the present embodiment, a distance of 100 μm is established between the diplexer 20 and the balun 40.

In order to achieve the satisfactory attenuation performance described above, it is preferable that the distance between the diplexer 20 and the balun 40 be greater than or equal to 50 μm, more preferable that this distance be greater than or equal to 100 μm, and even more preferable that this distance be greater than or equal to 200 μm. In consideration of preventing the circuit device from becoming too large, the upper limit for this distance is approximately 500 μm to 1 mm, for example.

Figure 8:
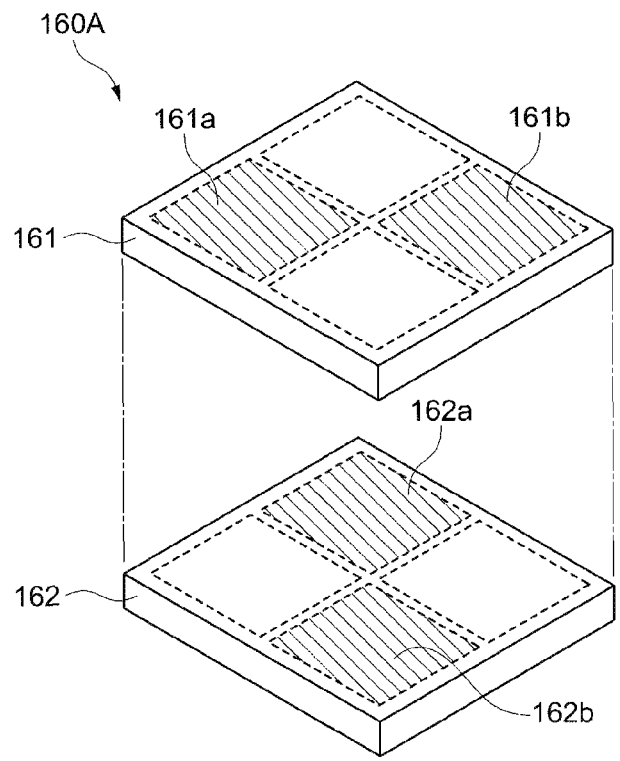
FIG. 8 illustrates a modification example of a circuit device in which a distance of greater than or equal to a prescribed value is maintained between a diplexer and a balun.

FIG. 8 illustrates a modification example of a circuit device in which a distance of greater than or equal to a prescribed value is maintained between a diplexer and a balun. As illustrated in FIG. 8, a circuit device 160A includes a first multilayer member 161 that primarily forms a balun and a second multilayer member 162 that primarily forms a diplexer, which are illustrated separated from one another. The first multilayer member 161 and the second multilayer member 162 each include a plurality of sheets that are layered together as described above.

The first multilayer member 161 that forms the balun can be conceptually divided into four areas, for example, when viewed from the layering direction (the vertical direction in the figure). A low frequency band area 161a and a high frequency band area 161b are arranged in two of the four areas that are arranged along a diagonal line, for example, and conductive patterns are formed in these areas 161a and 161b.

Similarly, the second multilayer member 162 that forms the diplexer can be conceptually divided into four areas that correspond to the four areas of the first multilayer member 161. An area 162a in which a low frequency band inductor electrode is formed and an area 162b in which a high frequency band inductor electrode is formed are arranged in two of the four areas that are arranged along a different diagonal line that intersects with the diagonal line of the first multilayer member 161.

In this configuration, the high frequency band areas are separated from the low frequency band areas, thereby making it possible to reduce electromagnetic coupling between the low frequency band signals and the high frequency band signals like in the embodiment described above. Moreover, although this configuration increases the size of the footprint of the circuit device 160A, this configuration also maintains a distance of greater than or equal to a prescribed value between the balun and the inductor electrodes of the diplexer, thereby making it possible to prevent deterioration of the attenuation properties.

4. Other Embodiments of Complex Circuit

Figure 9:
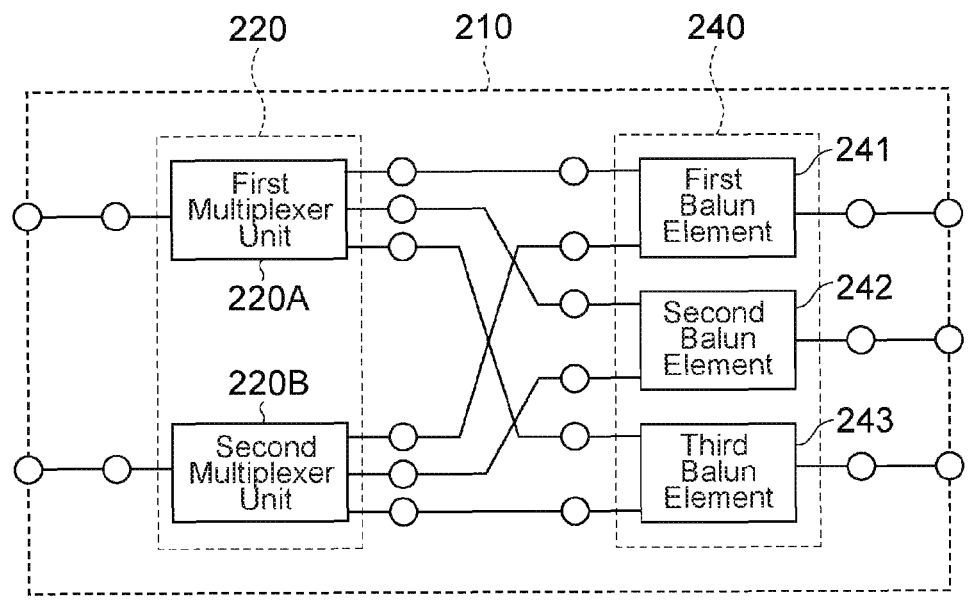
FIG. 9 is a block diagram that functionally and schematically illustrates a complex circuit according to another embodiment of the present invention.

In the embodiment described above, a diplexer 20 that multiplexes/demultiplexes signals on two different frequency bands is used as the diplexer 20. However, the complex circuit is not limited to this embodiment, and a multiplexer or the like that multiplexes/demultiplexes signals on three or more different frequency bands may also be used. For example, FIG. 9 illustrates a configuration of a complex circuit 210 that includes a multiplexer 220 that at least multiplexes or demultiplexes signals that primarily occupy three frequency bands. The multiplexer 220 includes a first multiplexer 220A (a first multiplexing/demultiplexing unit) and a second multiplexer 220B (a second multiplexing/demultiplexing unit).

The complex circuit 210 also includes a balun 240. The balun 240 includes three balun elements which are respectively connected to balanced lines along which (normal-phase and reverse-phase) signals that occupy a low frequency band, a high frequency band, and a frequency band therebetween (hereinafter, a "middle frequency band") are carried. More specifically, the balun 240 includes a first balun element 241 that passes through low frequency band signals, a second balun element 242 that passes through middle frequency band signals, and a third balun element that passes through high frequency band signals.

Figure 10:
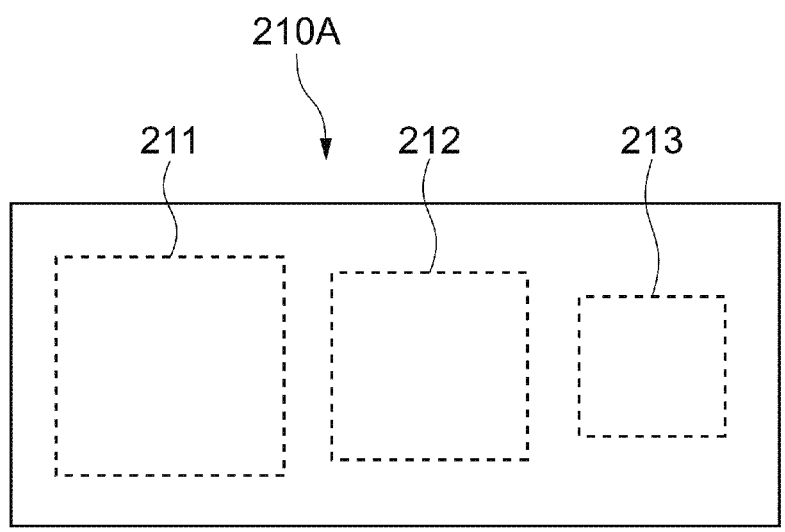
FIGS. 10A and 10B illustrate example configurations of areas in which conductive patterns are formed in a circuit device implementation of the complex circuit illustrated in FIG. 9.
Figure 10:
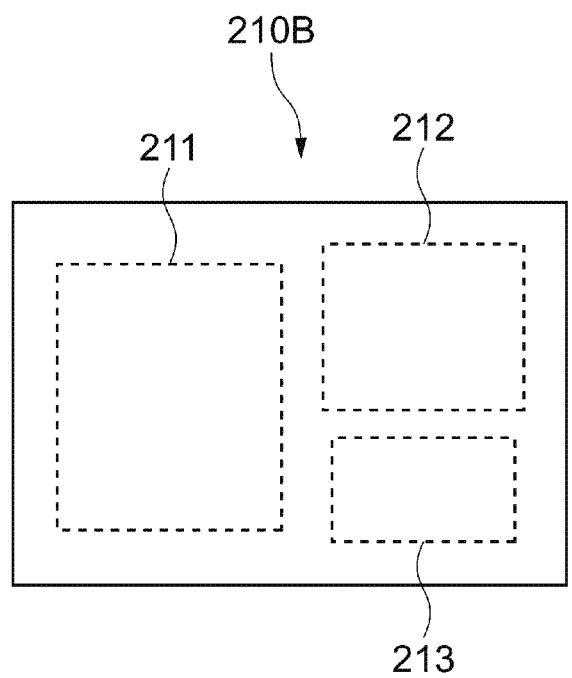

FIGS. 10A and 10B illustrate example configurations of areas in which conductive patterns of circuit device implementations 210A and 210B of the complex circuit 210 illustrated in FIG. 9 are formed. As illustrated in FIGS. 10A and 10B, the lines that carry the low, middle, and high frequency band signals are divided into areas 211, 212, and 213. The areas of the low frequency area 211, the middle frequency area 212, and the high frequency area 213 (that is, the envelope areas of the regions that envelop the lines) satisfy the same relationship as in the embodiment described above; that is, the lower the frequency of the signals carried in a given area, the larger the envelope area thereof (and the longer the length of the lines).

In the example of the circuit device 210A illustrated in FIG. 10A, the low frequency band area 211, the middle frequency band area 212, and the high frequency band area 213 are arranged in that order along one direction.

In the example of the circuit device 210B illustrated in FIG. 10B, the high frequency band area 213 (which has the shortest lines) and the middle frequency band area 212 (which has the next shortest lines) are arranged in one direction. Moreover, the low frequency band area 211 (which has the longest lines) is arranged along a different direction that is orthogonal to the direction in which the middle and high frequency band areas 212 and 213 are arranged.

These configurations of the complex circuit 210 and the circuit devices 210A and 210B all make it possible to achieve the same effects as in the complex circuit according to the embodiment described above.

5. Communication Device

Figure 11:
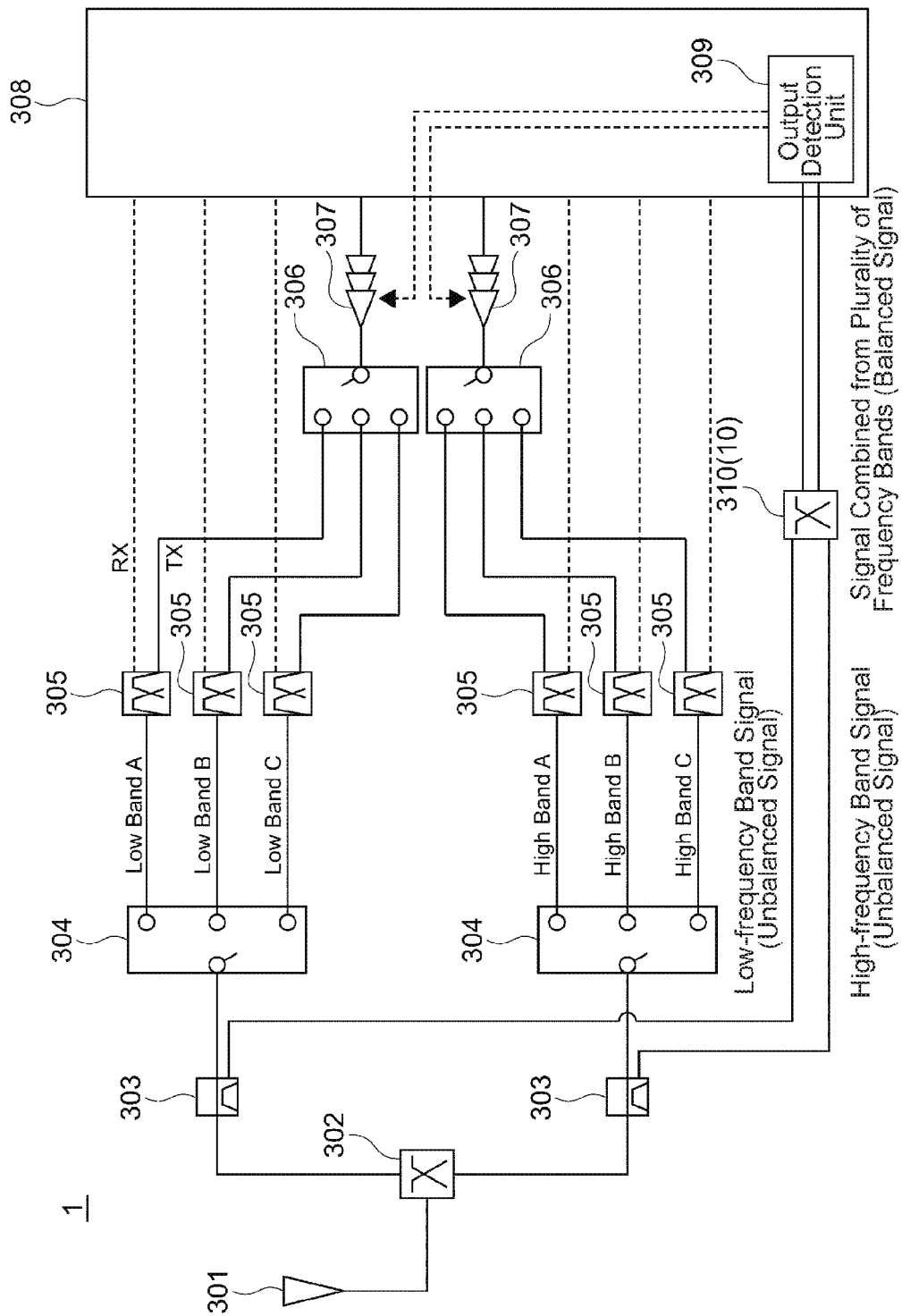
FIG. 11 is an RF block diagram illustrating a configuration of a wireless communication device as an example of a communication device equipped with the abovementioned complex circuit or circuit device.

FIG. 11 is an RF block diagram illustrating a configuration of a wireless communication device (here, a mobile phone) as an example of a communication device equipped with the complex circuit 10 or the circuit device 10A according to the embodiments described above.

This wireless communication device 1 is a mobile phone configured to support the Wideband Code Division Multiple Access (W-CDMA) and LTE communication standards. Here, W-CDMA and LTE are only listed as examples, and the wireless communication device 1 may also include a circuit block that supports the Global System for Mobile Communications (GSM, registered trademark) standard, for example.

In the present embodiment, Low Band A corresponds to Band 5 (824 to 894 Hz), Low Band B corresponds to Band 8 (880 to 960 Hz), Low Band C corresponds to Band 20 (791 to 845 Hz), High Band A corresponds to Band 1 (1920 to 2170 Hz), High Band B corresponds to Band 3 (1710 to 1880 Hz), and High Band C corresponds to Band 7 (2500 to 2690 Hz) in the W-CDMA and LTE communication standards.

The wireless communication device 1 includes an antenna 301, a diplexer 302, couplers 303, antenna switches 304, duplexers 305, switches 306, power amplifiers (PA) 307, an RF chipset (IC) 308, a balanced diplexer 310, and the like. The balanced diplexer 310 corresponds to the complex circuit 10 according to the embodiment described above.

One of the couplers 303, antenna switches 304, switches 306, and PAs 307 is for low frequency band signals, and the other coupler 303, antenna switch 304, switch 306, and PA 307 is for high frequency band signals. In FIG. 11, the components in the upper half of the figure are for the low frequency band signals and the components in the lower half of the figure are for the high frequency band signals.

The wireless communication device 1 also includes components other than the components illustrated in FIG. 11, such as a microphone, a speaker, a display, and various sensors. However, these components are not illustrated in FIG. 11 because none of these components are involved in the present description of the present embodiment.

Received signals that are input to the antenna 301 are demultiplexed by the diplexer 302 into low frequency band signals and high frequency band signals, and these demultiplexed signals are then passed through to the couplers 303. Next, the low frequency band signals and the high frequency band signals are input to the circuits for the appropriate frequency bands (the duplexers 305) as selected by the antenna switches 304, and then the signals are input to the IC 308. Of the received signals (RX) input to the duplexers 305, the received signals that are balanced and limited to a prescribed frequency band are output to a low noise amplifier (not illustrated in the figure). The duplexers 305 multiplex and demultiplex the received signals and the transmission signals (TX). The low noise amplifier amplifies the received signals input thereto and then outputs the resulting signals to the IC 308. The IC 308 applies a demodulation process to the received signals input thereto in order to produce audio signals and also controls the various functions of the wireless communication device 1.

Meanwhile, when transmitting signals, the IC 308 generates transmission signals. The PAs 307 amplify the generated transmission signals and input the resulting signals to the duplexers 305. Of the transmission signals input thereto, the duplexers 305 only pass through the signals that occupy a prescribed frequency band. Next, the transmission signals output from the duplexer 305 pass through the antenna switches 304 and the couplers 303 and are multiplexed together with the signal on the other frequency band by the diplexer 302. Finally, this multiplexed signal is output from the antenna 301 to outside of the wireless communication device 1.

During transmission, a small prescribed amount of power (approximately 1%) is extracted from the transmission signals as those signals pass through the couplers 303. The extracted signals constituted by this extracted power are sent to the balanced diplexer 310 (the complex circuit 10) to be multiplexed together with the extracted signal on the other frequency band and converted from unbalanced signals to a balanced signal. The balanced signal output from the balanced diplexer 310 is fed back into a power detector 309 of the IC 308. The IC 308 monitors this extracted power and adjusts the amplification of the PAs 307 accordingly in order to generate stable transmission signals.

As described above, the wireless communication device 1 includes the balanced diplexer 310 (the complex circuit 10), thereby making it possible to provide a communication device that supports a plurality of frequency bands.

Figure 12:
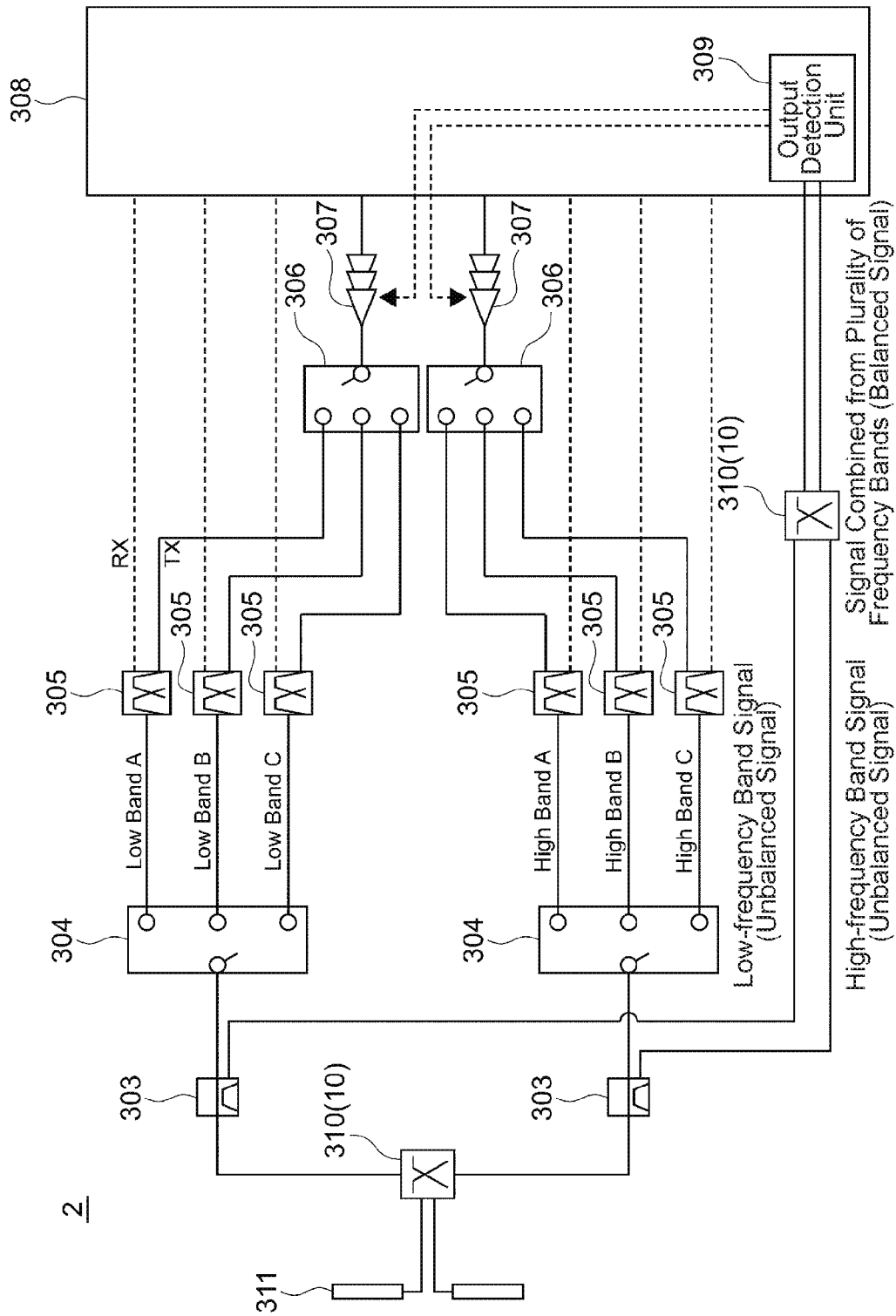
FIG. 12 is an RF block diagram illustrating a configuration of a modification example of the wireless communication device illustrated in FIG. 11.

FIG. 12 is an RF block diagram illustrating a configuration of a modification example of the wireless communication device 1 illustrated in FIG. 11. A wireless communication device 2 according to this example includes a dipole antenna 311 instead of the monopole antenna 301 of the wireless communication device 1 illustrated in FIG. 11. In this case, the abovementioned balanced diplexer 310 (complex circuit 10) is connected to both terminals of the dipole antenna 311.

6. Other Embodiments and Modification Examples

The present invention is not limited to the embodiments described above and can be implemented in the form of various other embodiments.

In the embodiments described above, the inductor electrodes 71, 72, 73, and 74 are formed in coil shapes and only on top of the dielectric sheet 105. However, in order to achieve higher inductance values, the inductor electrodes may be formed in spiral shapes spanning a plurality of dielectric sheets (here, "spiral-shaped" refers to a three-dimensional shape that extends in the layering direction). This configuration also makes it possible to achieve the same effects as in the embodiments described above. Moreover, the inductor electrodes may also be formed as two-layer structures in order to decrease the conductivity thereof and thereby improve the Q factors of the resulting inductors.

In the diplexer 20, the orders (numbers of stages) of the low-pass filters 21 and the high-pass filters 22 may be changed as necessary. Moreover, the balun 40 is not limited to the distributed constant balun in which striplines or the like are used as in the embodiments described above. A lumped constant balun in which chip inductors or chip capacitors are used may be used for the balun 40 instead.

Similarly, in the present working example the capacitor electrodes 81 to 86 are formed on the two dielectric sheets 102 and 103. However, these capacitor electrodes may instead be formed on three or more dielectric sheets according to the capacitance values required.

Although this was not discussed in the description of the embodiments above, an additional dielectric sheet may be layered on top of the dielectric sheet 111, and identification marks for identifying the direction in which the circuit device is facing (or the like) may be formed on top of that additional dielectric sheet.

In the embodiments described above, the dielectric sheets on which the conductive patterns are formed are layered together to form a single circuit device 10A as an implementation of the complex circuit 10. However, some of the conductive components of the complex circuit 10 such as the inductors, capacitors, and other electrodes may instead be formed on top of a circuit board (such as a semiconductor substrate or a resin mounting substrate), for example. In this case, elements such as inductors, capacitors, surface acoustic wave (SAW) elements, and other types of filter elements may be formed on the circuit board.

The material used for the dielectric sheets is not limited to ceramic materials. The same effects as in the embodiments described above can be achieved using almost any material that can be formed into a sheet shape, such as resin materials or glass materials.

The wireless communication devices illustrated in FIGS. 11 and 12 are merely examples. Any communication device that includes at least the complex circuit according to the present embodiment may be used to achieve the same effects as in the present embodiment even if the overall configuration of that communication device is different.

Additional alternative embodiments that combine at least two of the characteristic features of the embodiments described above can also be implemented.

DESCRIPTION OF REFERENCE CHARACTERS 1, 2 wireless communication device
10, 210 complex circuit
10A, 160A, 210A, 210B circuit device
11 first circuit pattern
12 second circuit pattern
20 diplexer
20A first diplexer
20B second diplexer
21 low-pass filter
22 high-pass filter
40, 240 balun
41, 42, 241, 242, 243 balun element
61 to 66 stripline electrode
71 to 74 inductor electrode
81 to 86 capacitor electrode
99 ground electrode
100, 161, 162 multilayer member
101 to 111 dielectric sheet (sheet)
161a, 211 low frequency band area
161b, 213 high frequency band area
162a area in which low frequency band inductor electrode is formed
162b area in which high frequency band inductor electrode is formed
220 multiplexer
220A first multiplexer
220B second multiplexer
301 antenna (monopole antenna)
310 balanced diplexer (complex circuit)
311 antenna (dipole antenna)

What is claimed is:

1. A circuit, comprising:
a multiplexing/demultiplexing unit, and a balun unit,
wherein the multiplexing/demultiplexing unit has a first multiplexing/demultiplexing unit that passes normal-phase signals of balanced signals of a plurality of differing frequency bands, and a second multiplexing/demultiplexing unit that passes reverse-phase signals of said balanced signals, and
wherein the balun unit includes a plurality of balun elements, each balun element having a single unbalanced line and a pair of balanced lines, said balanced lines being respectively connected to the first multiplexing/demultiplexing unit and the second multiplexing/demultiplexing unit for respectively passing the normal-phase signals and the reverse-phase signals of one of the frequency bands.

2. The circuit according to claim 1,
wherein the first multiplexing/demultiplexing unit has a first low-pass filter and a first high-pass filter, and
wherein the second multiplexing/demultiplexing unit has a second low-pass filter that has a same cutoff frequency as the first low-pass filter and a second high-pass filter that has a same cutoff frequency as the first high-pass filter.

3. The circuit according to claim 1, further comprising:
attenuation circuits that form attenuation poles for each of the frequency bands and that are respectively connected to the unbalanced lines of the balun elements.

4. A circuit device, comprising:
a multilayer member having a plurality of sheets on which conductive patterns are respectively layered together,
wherein the multilayer member has a first circuit pattern that forms a multiplexing/demultiplexing unit and a second circuit pattern that forms a balun unit,
wherein the multiplexing/demultiplexing unit formed by the first circuit pattern has a first multiplexing/demultiplexing unit that passes normal-phase signals of balanced signals of a plurality of differing frequency bands, and a second multiplexing/demultiplexing unit that passes reverse-phase signals of the balanced signals, and
wherein the balun unit formed by the second circuit pattern includes a plurality of balun elements, each balun element having a single unbalanced line and a pair of balanced lines, said balanced lines being respectively connected to the first multiplexing/demultiplexing unit and the second multiplexing/demultiplexing unit for respectively passing the normal-phase signals and the reverse-phase signals of one of the frequency bands.

5. The circuit device according to claim 4,
wherein the multilayer member includes a ground electrode sheet on which a ground electrode is formed, and
wherein, with respect to the multilayer member, one or more sheets of the first circuit pattern on which is formed a conductive pattern other than a conductive pattern formed on the ground electrode sheet is arranged between the ground electrode sheet and one or more sheets of the second circuit pattern on which is formed a conductive pattern other than the conductive pattern formed on the ground electrode sheet.

6. The circuit device according to claim 4, wherein at least the second circuit pattern has:
- a first area in which are formed lines that, among the signals of the plurality of frequency bands, pass signals that have a first frequency band; and
- a second area that is arranged separately from the first area when viewed from a layering direction of the multilayer member and in which are formed lines that, among the signals of the plurality of frequency bands, pass signals that have a second frequency band differing from the first frequency band.

7. The circuit device according to claim 6, wherein inductor electrodes that form a part of the first circuit pattern are divided between the first area and the second area when viewed from the layering direction of the multilayer member.

8. The circuit device according to claim 6, wherein a length of the lines formed in the first area of the second circuit pattern is different than a length of the lines formed in the second area of the second circuit pattern.

9. The circuit device according to claim 4,
wherein the multilayer member includes:
- one or more first sheets that have a first thickness and form a part of the second circuit pattern; and
- a second sheet that forms a part of the second circuit pattern, that is arranged between the one or more first sheets of the second circuit pattern and a sheet of the first circuit pattern, and that has a second thickness greater than the first thickness.

10. A circuit board, comprising:
- a substrate;
- a first circuit pattern forming a multiplexing/demultiplexing unit; and
- a second circuit pattern forming a balun unit,
- wherein the multiplexing/demultiplexing unit formed by the first circuit pattern has a first multiplexing/demultiplexing unit that passes normal-phase signals of balanced signals of a plurality of differing frequency bands, and a second multiplexing/demultiplexing unit that passes reverse-phase signals of the balanced signals,
- wherein the balun unit formed by the second circuit pattern includes a plurality of balun elements, each balun element having a single unbalanced line and a pair of balanced lines, said balanced lines being respectively connected to the first multiplexing/demultiplexing unit and the second multiplexing/demultiplexing unit for respectively passing the normal-phase signals and the reverse-phase signals of one of the frequency bands, and
- wherein at least a portion of lines of the first circuit pattern and a portion of lines of the second circuit pattern are formed on the substrate.

11. A communication device, comprising:
- an antenna that receives signals of a plurality of differing frequency bands or that outputs said signals; and
- a circuit that has a multiplexing/demultiplexing unit and a balun unit,
- wherein the multiplexing/demultiplexing unit of the circuit has a first multiplexing/demultiplexing unit that passes normal-phase signals of balanced signals of a plurality of differing frequency bands, and a second multiplexing/demultiplexing unit that passes reverse-phase signals of the balanced signals, and
- wherein the balun unit of the circuit includes a plurality of balun elements, each balun element having a single unbalanced line and a pair of balanced lines, said balanced lines being respectively connected to the first multiplexing/demultiplexing unit and the second multiplexing/demultiplexing unit for respectively passing the normal-phase signals and the reverse-phase signals of one of the frequency bands.

* * * * *